US012628637B2

(12) United States Patent
Liang et al.

(10) Patent No.: US 12,628,637 B2
(45) Date of Patent: May 12, 2026

(54) BACK END OF LINE INTERCONNECT STRUCTURE

(71) Applicant: International Business Machines Corporation, Armonk, NY (US)

(72) Inventors: Jim Shih-Chun Liang, Poughkeepsie, NY (US); Pouya Hashemi, Purchase, NY (US); Michael Robbins, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 379 days.

(21) Appl. No.: 18/534,978

(22) Filed: Dec. 11, 2023

(65) Prior Publication Data

US 2025/0192028 A1     Jun. 12, 2025

(51) Int. Cl.
*H10W 20/42* (2026.01)
*H10W 20/00* (2026.01)
*H10W 20/41* (2026.01)

(52) U.S. Cl.
CPC ......... *H10W 20/42* (2026.01); *H10W 20/033* (2026.01); *H10W 20/425* (2026.01)

(58) Field of Classification Search
None
See application file for complete search history.

(56) References Cited

U.S. PATENT DOCUMENTS

| | | |
|---|---|---|
| 7,084,479 B2 | 8/2006 | Chen et al. |
| 7,094,669 B2 | 8/2006 | Bu et al. |
| 8,883,611 B2 | 11/2014 | Lee et al. |
| 10,062,603 B2 | 8/2018 | Hsiao et al. |
| 10,199,235 B2 | 2/2019 | Wu et al. |
| 10,903,111 B2 | 1/2021 | Joseph Varghese et al. |
| 11,594,485 B2 | 2/2023 | Lin et al. |
| 2010/0206842 A1 | 8/2010 | Gu |
| 2015/0060856 A1 | 3/2015 | Tyberg et al. |
| 2022/0246534 A1* | 8/2022 | Chin .................. H10W 20/425 |
| 2022/0359385 A1 | 11/2022 | Lee et al. |

* cited by examiner

*Primary Examiner* — Anthony Ho

(74) *Attorney, Agent, or Firm* — CANTOR COLBURN LLP; Samuel Waldbaum

(57) ABSTRACT

Embodiments of the present disclosure include an interconnect structure having a via contact coupled to a middle of line (MOL) contact, a bottom of the via contact being free of a tantalum liner. A metal line is connected to the via contact, an interface between a top of the via contact and the metal line being free of the tantalum liner, the via contact and the metal line comprising copper, the via contact and the metal line being encapsulated with a cobalt liner.

20 Claims, 15 Drawing Sheets

100

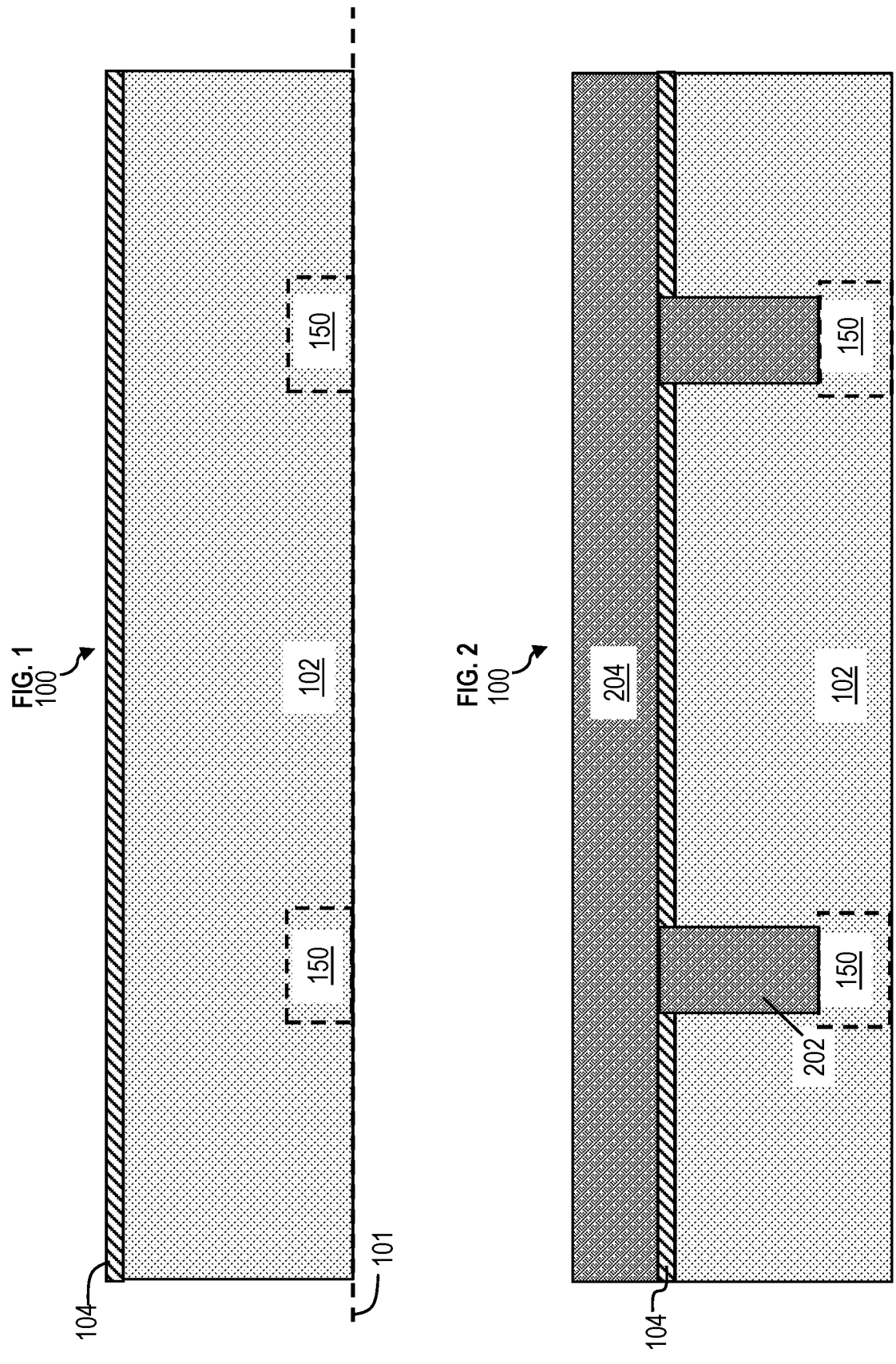

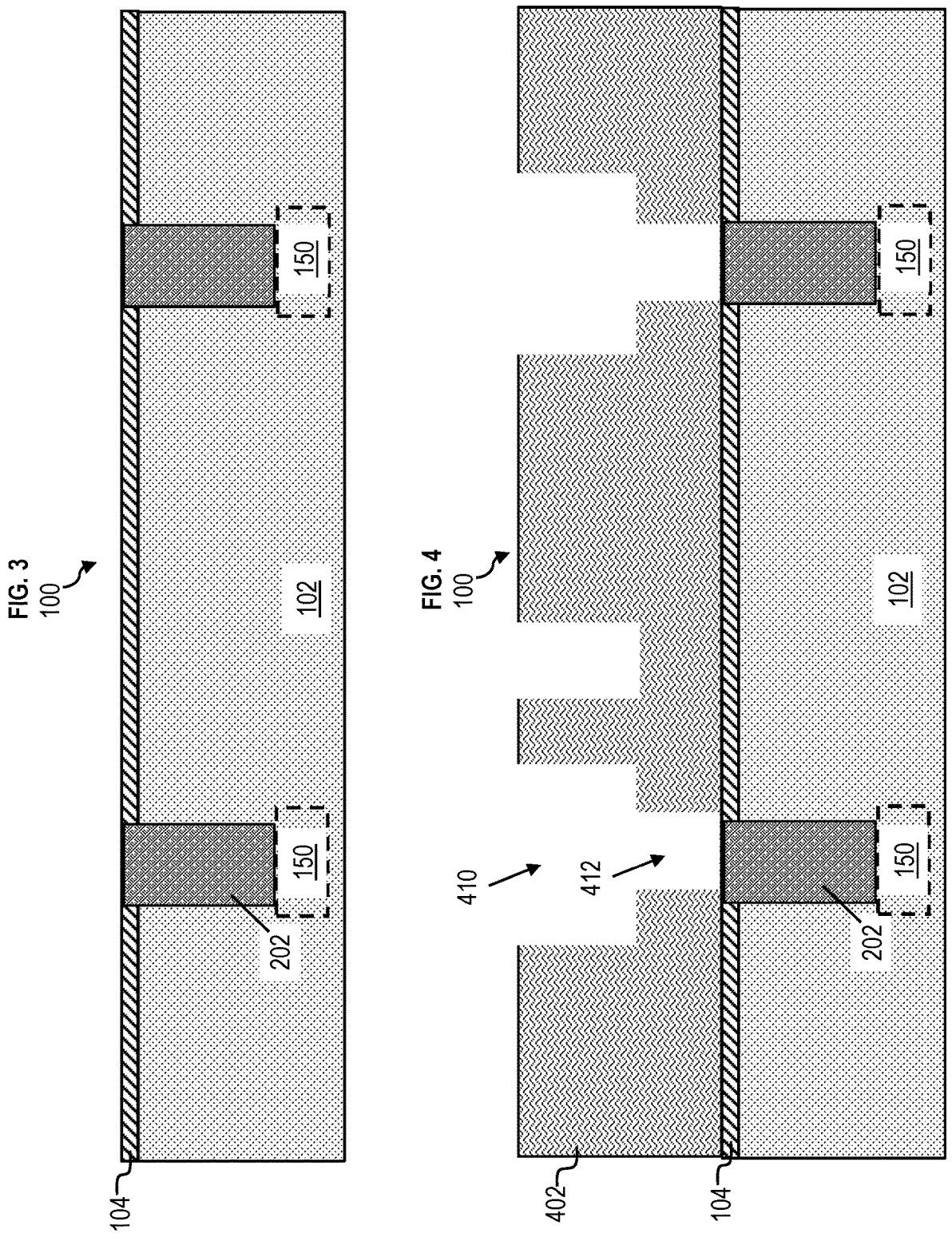

FIG. 5
100
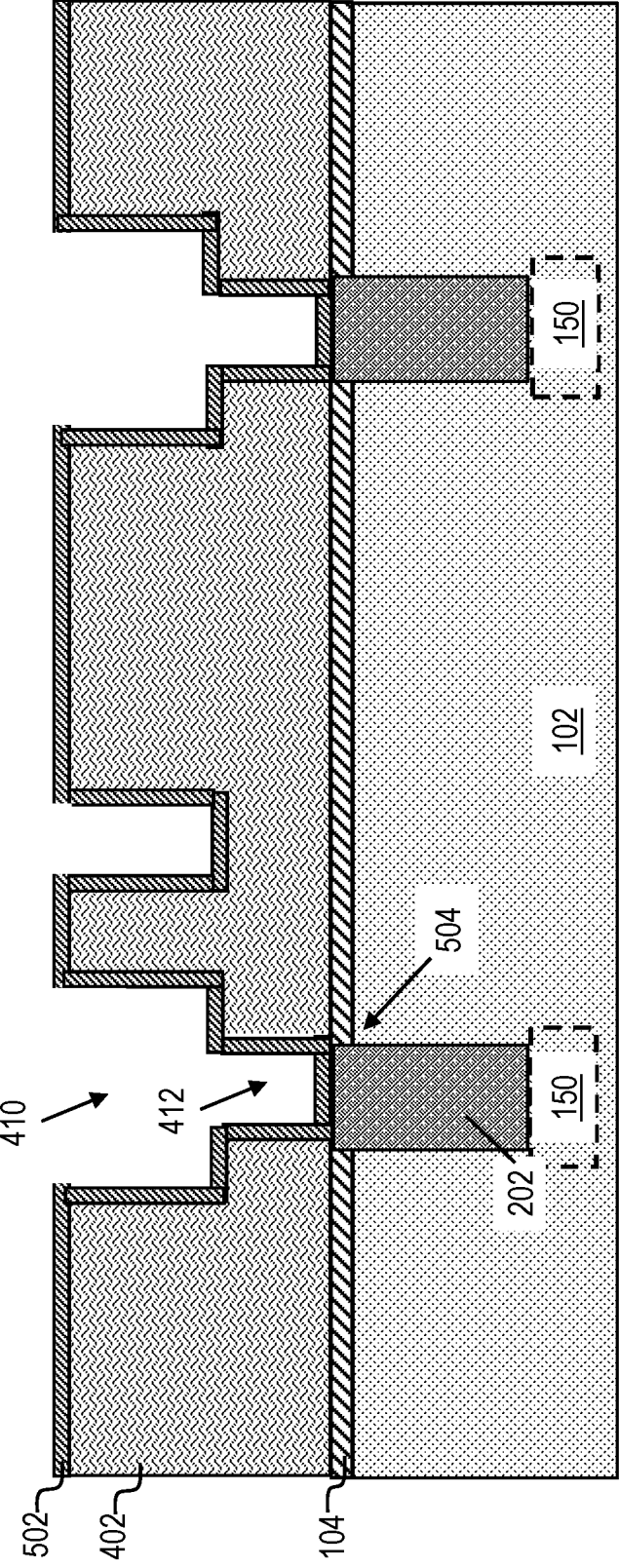

100

100

150

102

150

202

622

620

104

100

100

100

100

FIG. 13
100
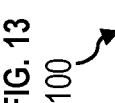
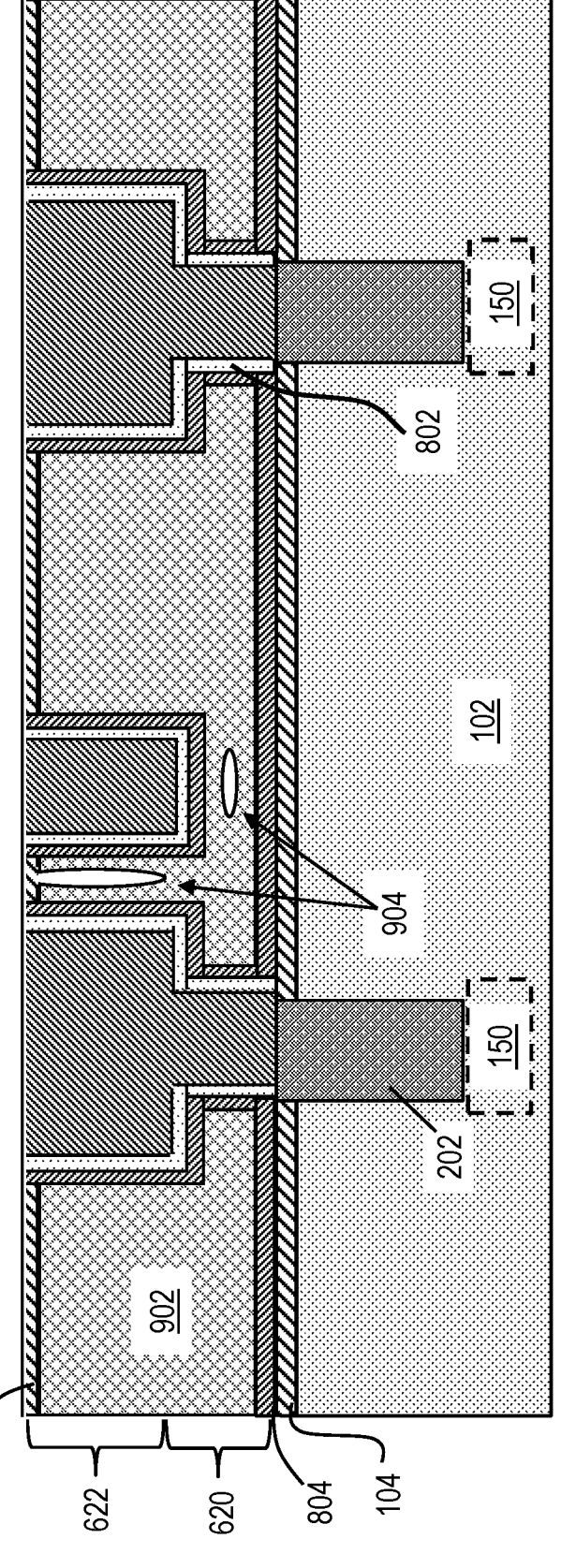

100

100

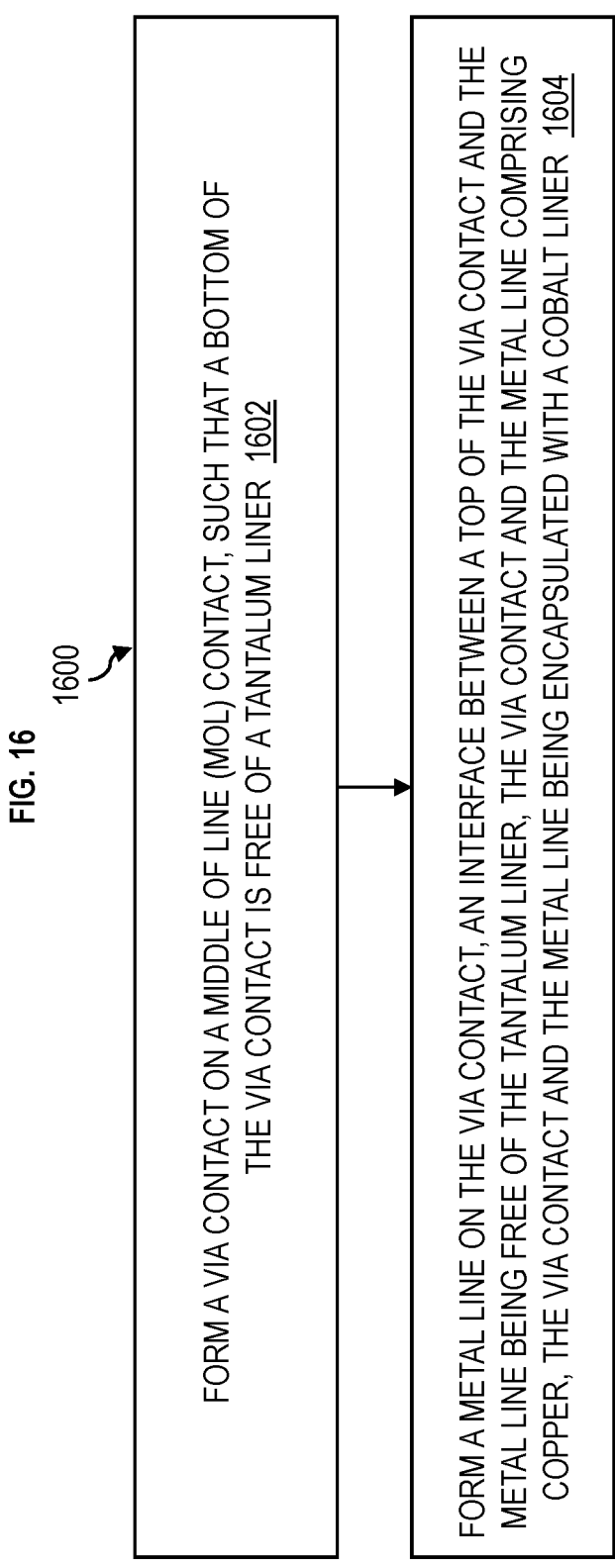

FORM A VIA CONTACT ON A MIDDLE OF LINE (MOL) CONTACT, SUCH THAT A BOTTOM OF THE VIA CONTACT IS FREE OF A TANTALUM LINER  1602

FORM A METAL LINE ON THE VIA CONTACT, AN INTERFACE BETWEEN A TOP OF THE VIA CONTACT AND THE METAL LINE BEING FREE OF THE TANTALUM LINER, THE VIA CONTACT AND THE METAL LINE COMPRISING COPPER, THE VIA CONTACT AND THE METAL LINE BEING ENCAPSULATED WITH A COBALT LINER  1604

FIG. 17 1700

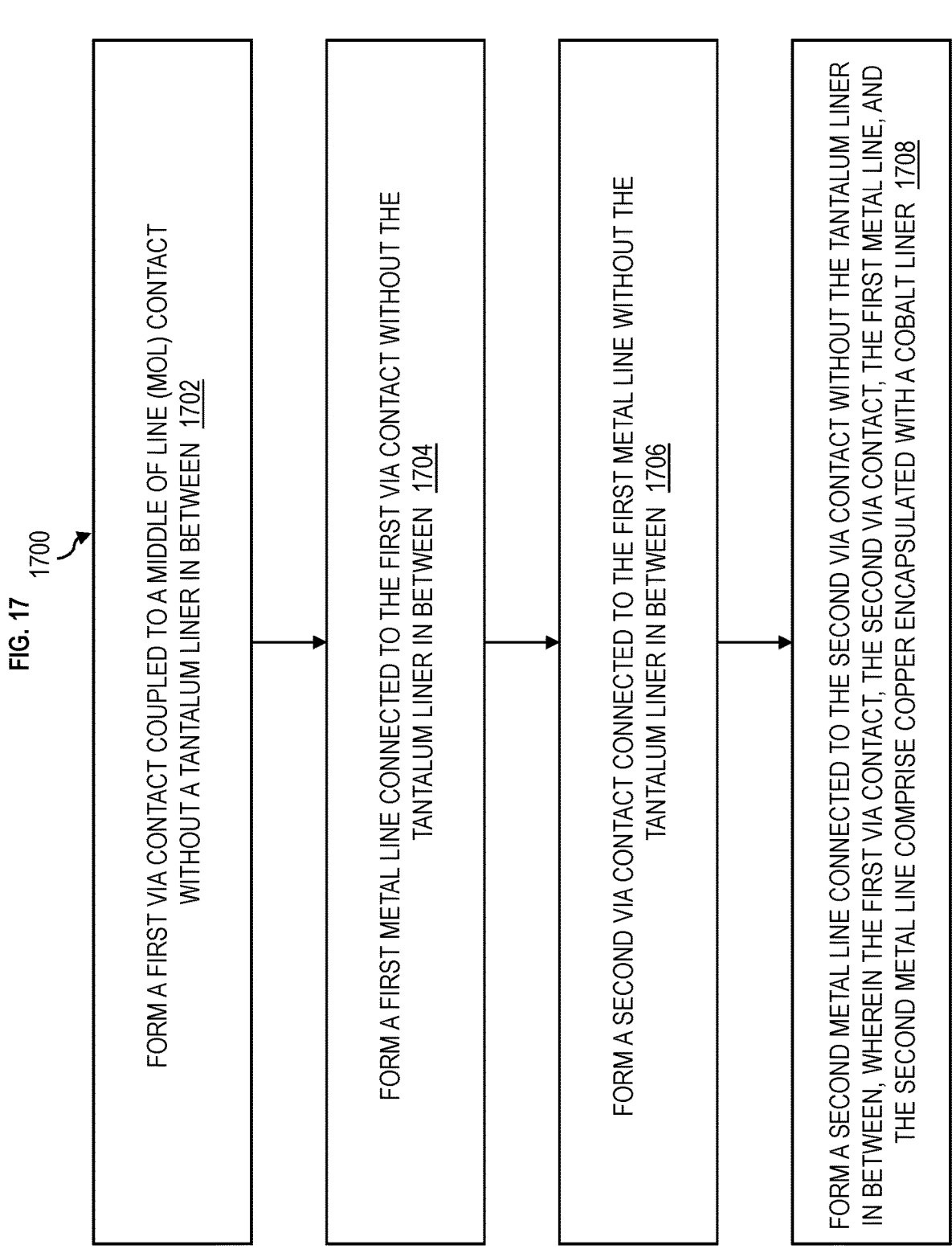

FORM A FIRST VIA CONTACT COUPLED TO A MIDDLE OF LINE (MOL) CONTACT WITHOUT A TANTALUM LINER IN BETWEEN 1702

FORM A FIRST METAL LINE CONNECTED TO THE FIRST VIA CONTACT WITHOUT THE TANTALUM LINER IN BETWEEN 1704

FORM A SECOND VIA CONTACT CONNECTED TO THE FIRST METAL LINE WITHOUT THE TANTALUM LINER IN BETWEEN 1706

FORM A SECOND METAL LINE CONNECTED TO THE SECOND VIA CONTACT WITHOUT THE TANTALUM LINER IN BETWEEN, WHEREIN THE FIRST VIA CONTACT, THE SECOND VIA CONTACT, THE FIRST METAL LINE, AND THE SECOND METAL LINE COMPRISE COPPER ENCAPSULATED WITH A COBALT LINER 1708

BACK END OF LINE INTERCONNECT STRUCTURE

BACKGROUND

The present invention generally relates to fabrication methods and resulting structures for integrated circuits (ICs), and more specifically, to fabrication methods and resulting structures for back-end-of-line (BEOL) interconnect structures.

ICs (also referred to as a chip or a microchip) include electronic circuits on a wafer. The wafer is a semiconductor material, such as, for example, silicon or other materials. An IC is formed of a large number of devices, such as transistors, capacitors, resistors, etc., which are formed in layers of the IC and interconnected with wiring in the BEOL layers of the wafer. Typical ICs are formed by first fabricating individual semiconductor devices using processes referred to generally as the front-end-of-line (FEOL).

SUMMARY

Embodiments of the present invention are directed to back-end-of-line (BEOL) interconnect structures. A non-limiting method of forming an interconnect structure. The method includes forming a via contact on a middle of line (MOL) contact, such that a bottom of the via contact is free of a tantalum liner. The method includes forming a metal line on the via contact, an interface between a top of the via contact and the metal line being free of the tantalum liner, the via contact and the metal line including copper, the via contact and the metal line being encapsulated with a cobalt liner.

According to one or more embodiments, an interconnect structure includes a first via contact coupled to a middle of line (MOL) contact without a tantalum liner in between and a first metal line connected to the first via contact without the tantalum liner in between. The interconnect structures include a second via contact connected to the first metal line without the tantalum liner in between and a second metal line connected to the second via contact without the tantalum liner in between, where the first via contact, the second via contact, the first metal line, and the second metal line include copper encapsulated with a cobalt liner.

Other embodiments of the present invention implement features of the above-described devices/structures in methods and/or implement features of the methods in devices/structures.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1 depicts a cross-sectional view of a portion of an integrated circuit (IC) under-fabrication after fabrication operations according to one or more embodiments of the invention;

FIG. 2 depicts a cross-sectional view of a portion of an IC under-fabrication after fabrication operations according to one or more embodiments of the invention;

FIG. 3 depicts a cross-sectional view of a portion of an IC under-fabrication after fabrication operations according to one or more embodiments of the invention;

FIG. 4 depicts a cross-sectional view of a portion of an IC under-fabrication after fabrication operations according to one or more embodiments of the invention;

FIG. 5 depicts a cross-sectional view of a portion of an IC under-fabrication after fabrication operations according to one or more embodiments of the invention;

FIG. 13 depicts a cross-sectional view of a portion of an IC under-fabrication after fabrication operations according to one or more embodiments of the invention;

FIG. 16 depicts a flowchart of a method of forming an interconnect structure according to one or more embodiments of the invention; and FIG. 17 depicts a flowchart of a method of forming an interconnect structure according to one or more embodiments of the invention.

DETAILED DESCRIPTION

Figure 6:
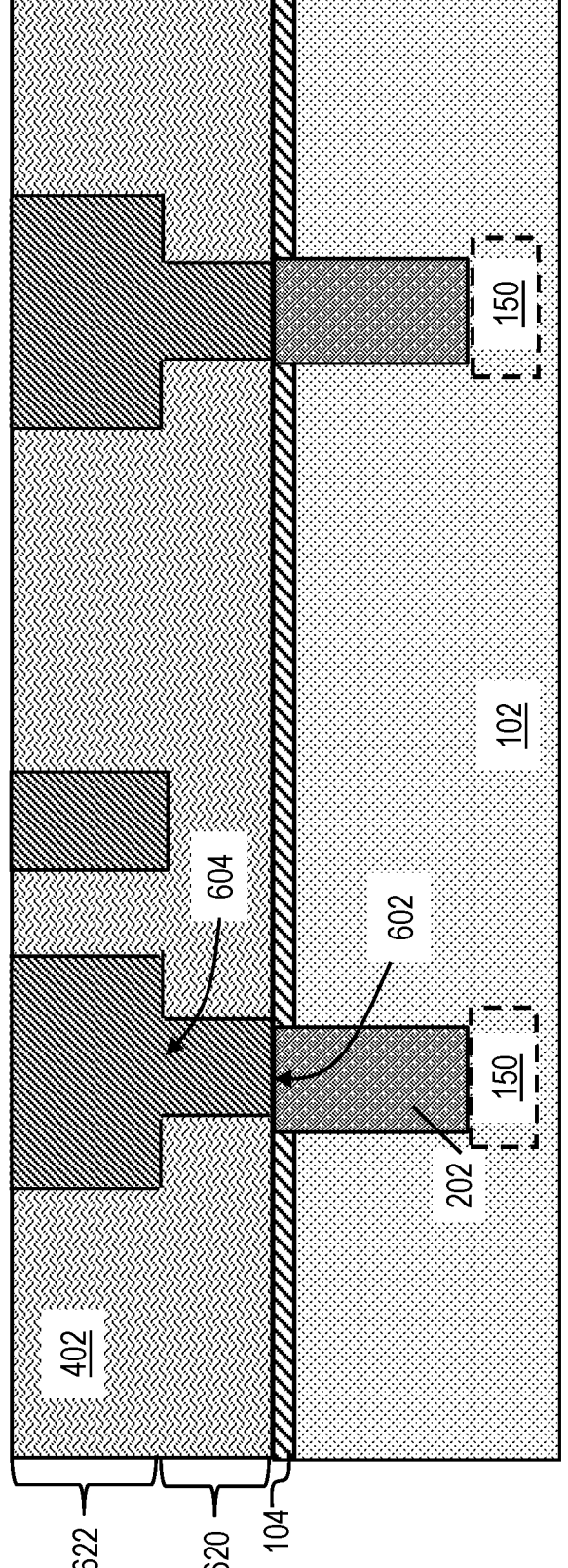
FIG. 6 depicts a cross-sectional view of a portion of an IC under-fabrication after fabrication operations according to one or more embodiments of the invention.

One or more embodiments of the present invention relate to back-end-of-line (BEOL) interconnect structures. An interconnect structure includes a via contact coupled to a middle of line (MOL) contact, a bottom of the via contact being free of a tantalum liner. The interconnect structure includes a metal line connected to the via contact, where an interface between a top of the via contact and the metal line is free of the tantalum liner. The via contact and the metal line have copper, the via contact and the metal line being encapsulated with a cobalt liner.

This provides improved BEOL wiring and via contact resistances by using copper wires without the TaN/Ta liner to increase copper volume and reduce wiring resistance. The copper wire and via contact can be encapsulated with a thin layer of cobalt to improve electromigration (EM) reliability and/or with an Nblok cap (or other kinds of dielectric cap)

to improve EM reliability. The via contacts are formed with no bottom liner to improve via contact resistance, because there is no TaN/Ta liner to increase the resistance of the via contact. Air gaps can be formed between and under the wiring to reduce wiring capacitance. The process can be repeated for further Mx levels such as the M1 metal layer, M2 metal layer, M3 metal layers, and so forth. Further, one or more embodiments use traditional fabrication materials (i.e., copper) as the via contacts and wiring (i.e., BEOL metals) avoiding the need for Ru, Ir, etc.

In addition to one or more of the features described above or below, additional features include where the via contact and the metal line are free of the tantalum liner further comprising nitride. This advantageously reduces the resistance of the via contact and metal line.

In addition to one or more of the features described above or below, additional features include where the via contact and the metal line are free of a stack of another tantalum liner on top of the tantalum liner further comprising nitride. This advantageously reduces the resistance of the via contact and metal line.

In addition to one or more of the features described above or below, additional features include where a cap layer encapsulates the cobalt liner. This advantageously reduces EM.

In addition to one or more of the features described above or below, additional features include where the cap layer includes silicon carbide or a low-k dielectric material doped with nitrogen. This advantageously reduces EM.

In addition to one or more of the features described above or below, additional features include where the cap layer has a thickness ranging from about 0.1 nanometers (nm) to about 1 nm. This advantageously reduces EM while avoiding an increase in capacitance.

In addition to one or more of the features described above or below, additional features include where a MOL cap layer is formed coplanar with a top surface of the MOL contact such that any misalignment of the via contact and the MOL contact causes a portion of the via contact to be disposed on the MOL cap layer. This advantageously reduces EM by providing protection from copper from landing on any underlayer, because of the presence of the MOL cap layer.

In addition to one or more of the features described above or below, additional features include where the MOL contact includes tungsten. This provides good conductivity.

According to one or more embodiments, a method for an interconnect structure is provided. The method includes forming a via contact on a middle of line (MOL) contact, such that a bottom of the via contact is free of a tantalum liner. The method includes forming a metal line on the via contact, an interface between a top of the via contact and the metal line being free of the tantalum liner. The via contact and the metal line include copper, the via contact and the metal line being encapsulated with a cobalt liner.

This provides improved BEOL wiring and via contact resistances by using copper wires without the TaN/Ta liner to increase copper volume and reduce wiring resistance. The copper wire and via contact can be encapsulated with a thin layer of cobalt to improve electromigration (EM) reliability and/or with an Nblok cap (or other kinds of dielectric cap) to improve EM reliability. The via contacts are formed with no bottom liner to improve via contact resistance, because there is no TaN/Ta liner to increase the resistance of the via contact. Air gaps can be formed between and under the wiring to reduce wiring capacitance. The process can be repeated for further Mx levels such as the M1 metal layer, M2 metal layer, M3 metal layers, and so forth. Further, one or more embodiments use traditional fabrication materials (i.e., copper) as the via contacts and wiring (i.e., BEOL metals) avoiding the need for Ru, Ir, etc.

In addition to one or more of the features described above or below, additional features include where the via contact and the metal line are free of the tantalum liner further comprising nitride. This advantageously reduces the resistance of the via contact and metal line.

In addition to one or more of the features described above or below, additional features include where the via contact and the metal line are free of a stack of another tantalum liner on top of the tantalum liner further comprising nitride. This advantageously reduces the resistance of the via contact and metal line.

In addition to one or more of the features described above or below, additional features include where a cap layer encapsulates the cobalt liner. This advantageously reduces EM.

In addition to one or more of the features described above or below, additional features include where the cap layer includes silicon carbide or a low-k dielectric material doped with nitrogen. This advantageously reduces EM.

In addition to one or more of the features described above or below, additional features include where the cap layer has a thickness ranging from about 0.1 nm to about 1 nm. This advantageously reduces EM while avoiding an increase in capacitance.

In addition to one or more of the features described above or below, additional features include where a MOL cap layer is formed coplanar with a top surface of the MOL contact such that any misalignment of the via contact and the MOL contact causes a portion of the via contact to be disposed on the MOL cap layer. This advantageously reduces EM by providing protection from copper from landing on any underlayer, because of the presence of the MOL cap layer.

In addition to one or more of the features described above or below, additional features include where the MOL contact includes tungsten. This provides good conductivity.

According to one or more embodiments, an interconnect structure is provided. The interconnect structure includes a first via contact coupled to a middle of line (MOL) contact without a tantalum liner in between and a first metal line connected to the first via contact without the tantalum liner in between. The interconnect structure includes a second via contact connected to the first metal line without the tantalum liner in between and a second metal line connected to the second via contact without the tantalum liner in between, where the first via contact, the second via contact, the first metal line, and the second metal line include copper encapsulated with a cobalt liner.

This provides improved BEOL wiring and via contact resistances by using copper wires without the TaN/Ta liner to increase copper volume and reduce wiring resistance. The copper wire and via contact can be encapsulated with a thin layer of cobalt to improve electromigration (EM) reliability and/or with an Nblok cap (or other kinds of dielectric cap) to improve EM reliability. The via contacts are formed with no bottom liner to improve via contact resistance, because there is no TaN/Ta liner to increase the resistance of the via contact. Air gaps can be formed between and under the wiring to reduce wiring capacitance. The process can be repeated for further Mx levels such as the M1 metal layer, M2 metal layer, M3 metal layers, and so forth. Further, one or more embodiments use traditional fabrication materials (i.e., copper) as the via contacts and wiring (i.e., BEOL metals) avoiding the need for Ru, Ir, etc.

In addition to one or more of the features described above or below, additional features include where the first via contact, the second via contact, the first metal line, and the second metal line are free of the tantalum liner further including nitride. This advantageously reduces the resistance of the via contact and metal line.

In addition to one or more of the features described above or below, additional features include where the first via contact, the second via contact, the first metal line, and the second metal line are free of a stack of another tantalum liner on top of the tantalum liner further including nitride. This advantageously reduces the resistance of the via contact and metal line.

In addition to one or more of the features described above or below, additional features include where a cap layer encapsulates the cobalt liner; the cap layer includes silicon carbide or a low-k dielectric material doped with nitrogen; and the cap layer has a thickness ranging from about 0.1 nm to about 1 nm. This advantageously reduces EM while avoiding an increase in capacitance.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Technical benefits and effects enable a low resistance interconnect structure of the via contact and the wiring while using copper for both the via contact and wire. Typically, copper wires are surrounded with a liner (such as a TaN/Ta liner), and this liner occupies a larger fraction of the volume of the interconnect structure as more advanced nodes or devices scale down in size, thereby increasing the resistance of the interconnect structure. Embodiments provide a technique to form a low resistance interconnect structure of copper without having to replace the copper with other materials such as ruthenium, iridium, etc., and without requiring a TaN liner or a TaN/Ta liner.

Turning now to a more detailed description of aspects of the present invention, FIG. 1 depicts a cross-sectional view of a portion of an integrated circuit (IC) 100. Standard semiconductor fabrication techniques can be utilized to fabricate IC 100 as understood by one of ordinary skill in the art. Any suitable lithography processes including deposition techniques and etching techniques can be utilized herein.

FIG. 1 depicts the IC 100 having a wafer where several fabrication processes have been performed. The wafer may be denoted as substrate 101. Example materials of the substrate 101 can silicon and other semiconductor materials. Numerous devices 150 can be formed on/in the substrate 101 as understood by one of ordinary skill in the art. Example devices 150 can include transistors, capacitors, inductors, memory devices, etc., formed in and on the substrate 101.

An interlayer dielectric layer (ILD) 102 is formed on the substrate 101, and a cap layer 104 is formed on the ILD 102. The ILD 102 can be an oxide such as silicon dioxide ($SiO_2$). The ILD 102 can be a low-k dielectric material, an ultra-low-k dielectric material, etc. The ILD 102 may be referred to as middle-of-line (MOL) oxide.

The cap layer 104 may be referred to as a MOL cap layer. Example materials for the cap layer 104 can include silicon carbide (SiC), nitrogen doped barrier low-k dielectric (Nblok) material, aluminum oxide/aluminum nitride (AlO/AlN), etc. The Nblok can include nitrogen doped silicon carbide (SiC:N).

FIG. 2 depicts the IC 100 after metallization. Lithography is performed to form trenches that expose the contacts of the devices 150, and the trenches are filled with metal 204 thereby forming middle-of-line (MOL) contacts 202 electrically and physically coupled to the devices 150. Example metals for the MOL contacts 202 can include tungsten (W), cobalt (Co), gold (Au), etc. Although not shown, a Ti/TiN liner can be deposited before depositing the metal forming the MOL contacts 202. In one or more embodiments, the MOL contacts 202 can be coupled to the source/drain regions of transistors, and the titanium on the bottom of the Ti/TiN liner forms a silicide with the source/drain regions. One of the MOL contacts 202 is purposely shown as misaligned to illustrate that the cap layer 104 allows for copper (as depicted in FIGS. 5 and 6) to land on the cap layer 104 during misalignment, thereby providing electromigration protection.

FIG. 3 depicts the IC 100 after removing a portion of the deposited metal 204, leaving the MOL contacts 202 coplanar with the cap layer 104. Etching and/or chemical mechanical polishing/planarization (CMP) can be utilized. For example, the CMP stops on the cap layer 104.

FIG. 4 depicts the IC 100 after deposition of a sacrificial layer and via and wire patterning. A sacrificial layer 402 is deposited and patterned to form trenches 412 as the locations for the future via contacts and the trenches 410 as the locations for future metal lines/wires. The trenches 410 and 412 can be formed using, for example, dual damascene patterning or any suitable process. Example materials of the sacrificial layer 402 can include amorphous carbon, transparent carbon, silicon nitride (SiN), photoresist materials, tetraethyl orthosilicate (TEOS), and organic materials like an organic planarization layer (OPL).

FIG. 5 depicts the IC 100 after deposition of a copper seed. A copper seed layer 502 is deposited in preparation for depositing copper to form the contact via (e.g., V0 contact) and metal line/wire (M1 metal line/wire). The copper seed layer 502 can be pure copper, copper doped with manganese (Mn), etc. In the copper seed layer 502, the Mn be less than 5% atomic percent while the remaining atomic percent is pure copper. The copper seed layer 502 may be deposited using, for example, physical vapor deposition (PVD). As noted herein, one or more embodiments can accommodate misalignment 504 because it does not matter if the copper seed layer 502 lands on the cap layer 104, because the cap layer 104 serves as a diffusion barrier (i.e., protection). The cap layer 104 is a material that binds well to copper.

FIG. 6 depicts the IC 100 after copper platting and CMP. Copper is deposited in the trenches 410 and 412, which forms via contacts 620 and metal lines/wires 622. As can be seen, there is a linerless via contact bottom 602 for improved resistance. The via contacts 620 may be considered V0 via contacts, the metal lines/wires 622 may be considered M1 metal lines. The interface between the via contacts 620 (V0) and the metal lines/wires 622 (M1) is a (TaN/Ta) linerless interface 604, meaning that no TaN/Ta liner (or any liner) is present.

Figure 7:
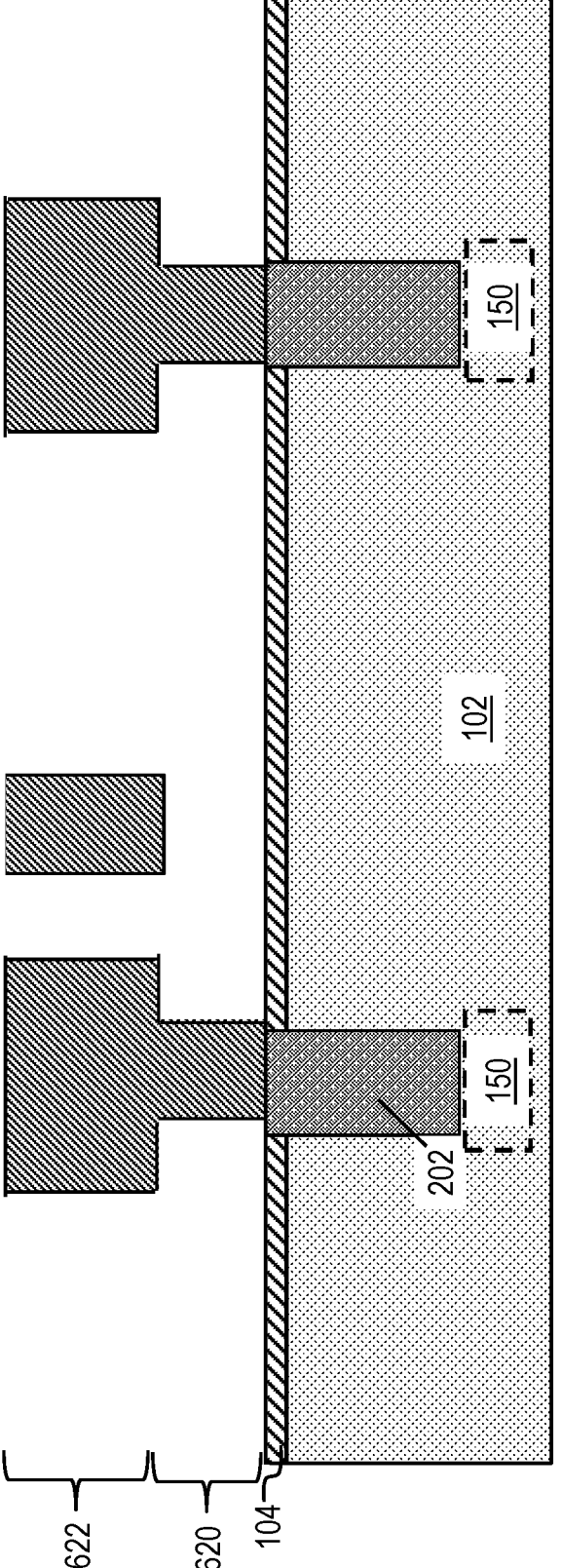
FIG. 7 depicts a cross-sectional view of a portion of an IC under-fabrication after fabrication operations according to one or more embodiments of the invention.

FIG. 7 depicts the IC 100 after stripping the sacrificial layer. The sacrificial layer 402 can be etched away using suitable techniques according to the type of material, such as a reducing chemistry which does not utilize oxygen resulting in oxidation.

When the sacrificial layer 402 is an organic material, a nitrogen and hydrogen ash ($N_2$ and $H_2$ ash) can be utilized to remove the sacrificial layer 402. If the sacrificial layer 402 is SiN by atomic layer deposition, TEOS, etc., hydrofluoric (HF) acid can be utilized to remove the sacrificial layer 402. It is noted that although one of the metal lines/wires 622 may appear to be floating, it is anchored down by another via contact 620 (not shown) just as the other metal lines/wires 622.

Figure 8:
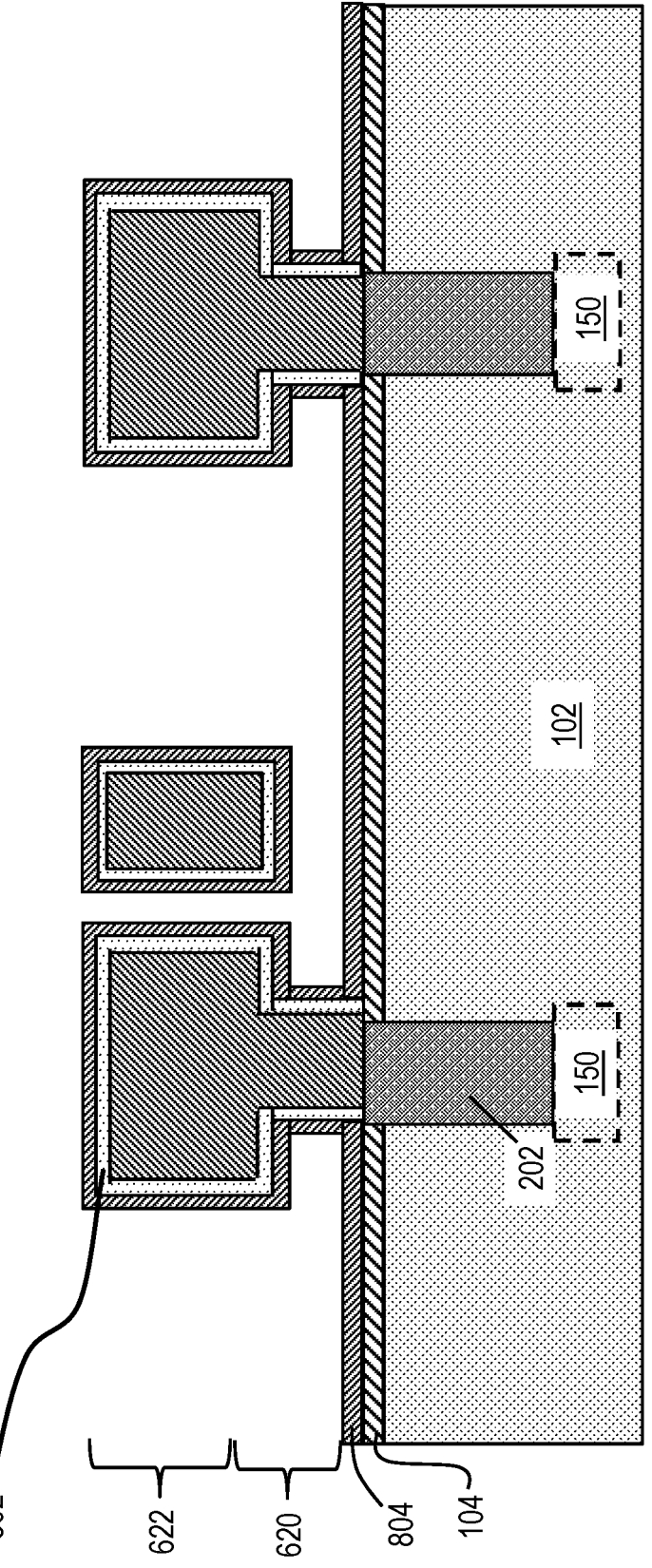
FIG. 8 depicts a cross-sectional view of a portion of an IC under-fabrication after fabrication operations according to one or more embodiments of the invention.

FIG. 8 depicts the IC 100 after depositing a cobalt layer and cap for reliability. The cobalt layer 802 is deposited to selectively form on the copper material, thereby not forming on the cap layer 104. The deposited cobalt is a thin layer, and the cobalt has difficulty forming on a dielectric, such as the cap layer 104. Also, the cobalt has difficulty forming on the MOL contacts 202, but it would not be an issue if a little cobalt were present. The thickness of the cobalt layer 802 is about 0.1 to about 3 nanometers (nm). As can be seen, the cobalt layer 802 wraps around the copper structure of the via contact 620 and the metal line/wire 622.

Another cap layer 804 is deposited. Examples of the cap layer 804 can include Nblok, SiN, etc. In one or more embodiments, the cap layer 804 is very thin, for example, about 1 nm and below. The cap layer 804 is thin to avoid any capacitance penalty.

Figure 9:
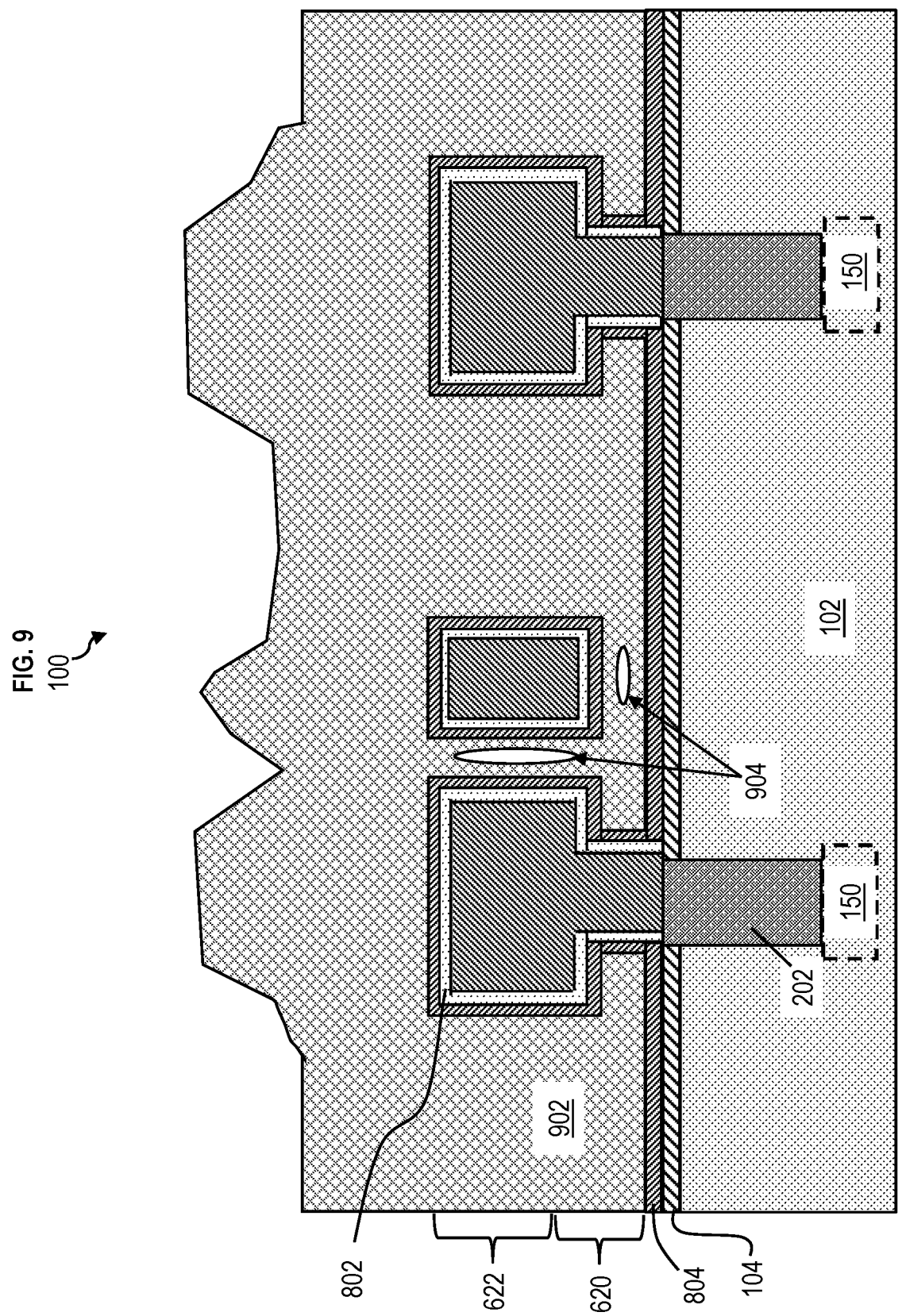
FIG. 9 depicts a cross-sectional view of a portion of an IC under-fabrication after fabrication operations according to one or more embodiments of the invention.

FIG. 9 depicts the IC 100 after deposition of M1 dielectric. ILD material is deposited to form an M1 dielectric layer 902. The M1 dielectric layer 902 can be a low-k dielectric material, an ultra-low-k dielectric material, etc. The M1 dielectric layer 902 can be an oxide material. During deposition, one or more air gaps 904 can be formed. Particularly, the air gaps 904 below the metal lines/wires 622 are formed when the width of the metal line/wire 622 is large compared to the distance between metal line/wire 622 and the cap layer 804.

Figure 10:
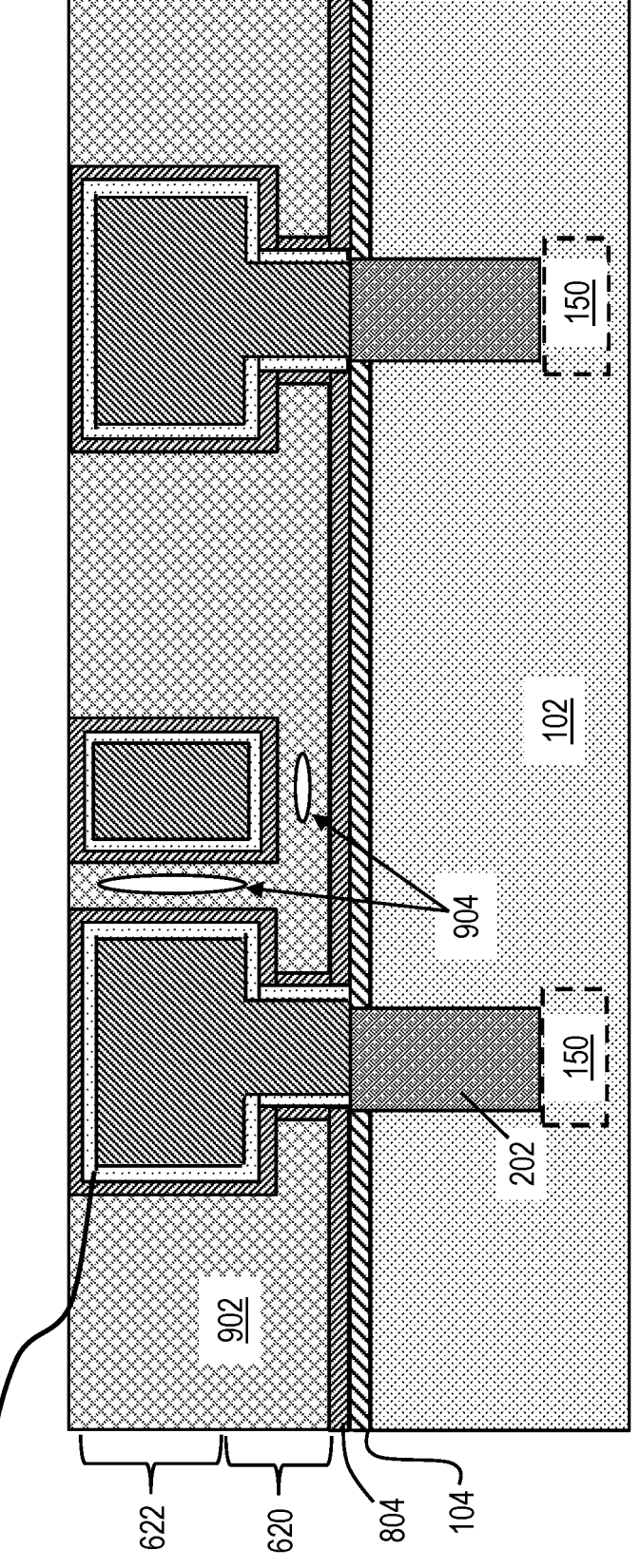
FIG. 10 depicts a cross-sectional view of a portion of an IC under-fabrication after fabrication operations according to one or more embodiments of the invention.
Figure 11:
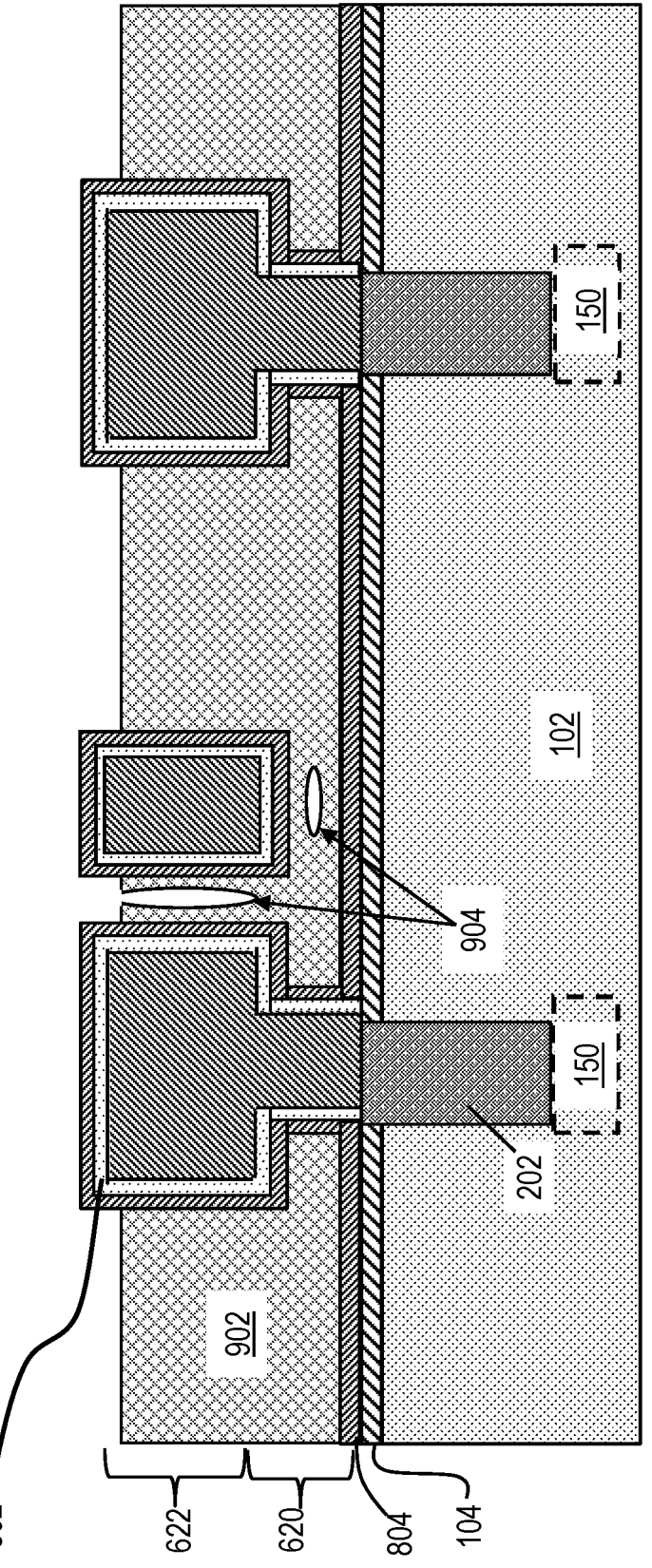
FIG. 11 depicts a cross-sectional view of a portion of an IC under-fabrication after fabrication operations according to one or more embodiments of the invention.
Figure 12:
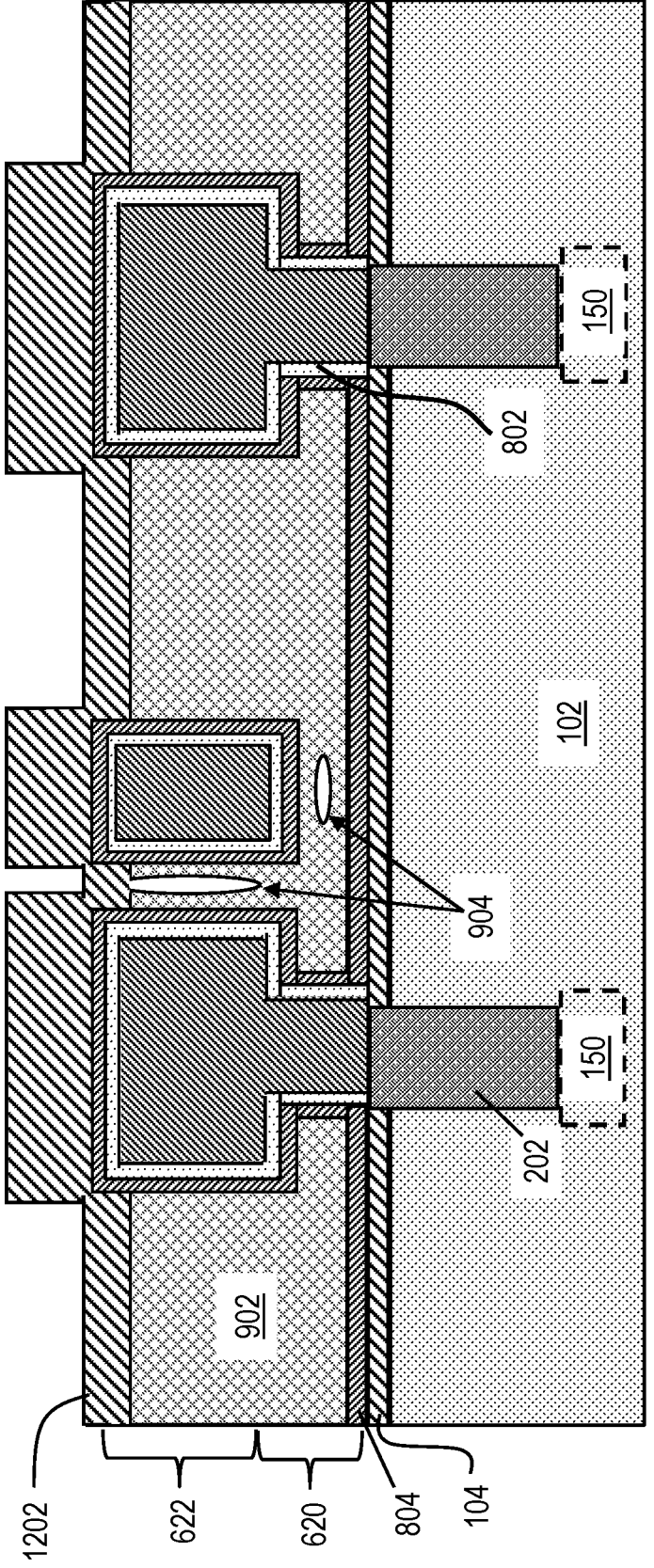
FIG. 12 depicts a cross-sectional view of a portion of an IC under-fabrication after fabrication operations according to one or more embodiments of the invention.

FIG. 10 depicts the IC 100 after performing CMP stopping on the cap layer 804. FIG. 11 depicts the IC 100 after recessing the M1 dielectric layer in preparation to repeat the process. FIG. 12 depicts the IC 100 after depositing an M1 cap layer 1202. Example materials for the M1 cap layer 120 can include the materials discussed for the cap layer 104.

FIG. 13 depicts the IC 100 after performing CMP to planarize. In FIG. 13, the M1 cap layer 1202 and the top surface of the copper of the metal lines/wires 622 are coplanar. Note that the top surface of the metal lines/wires 622 is now missing the Co layer 802, which gets polished away.

Figure 14:
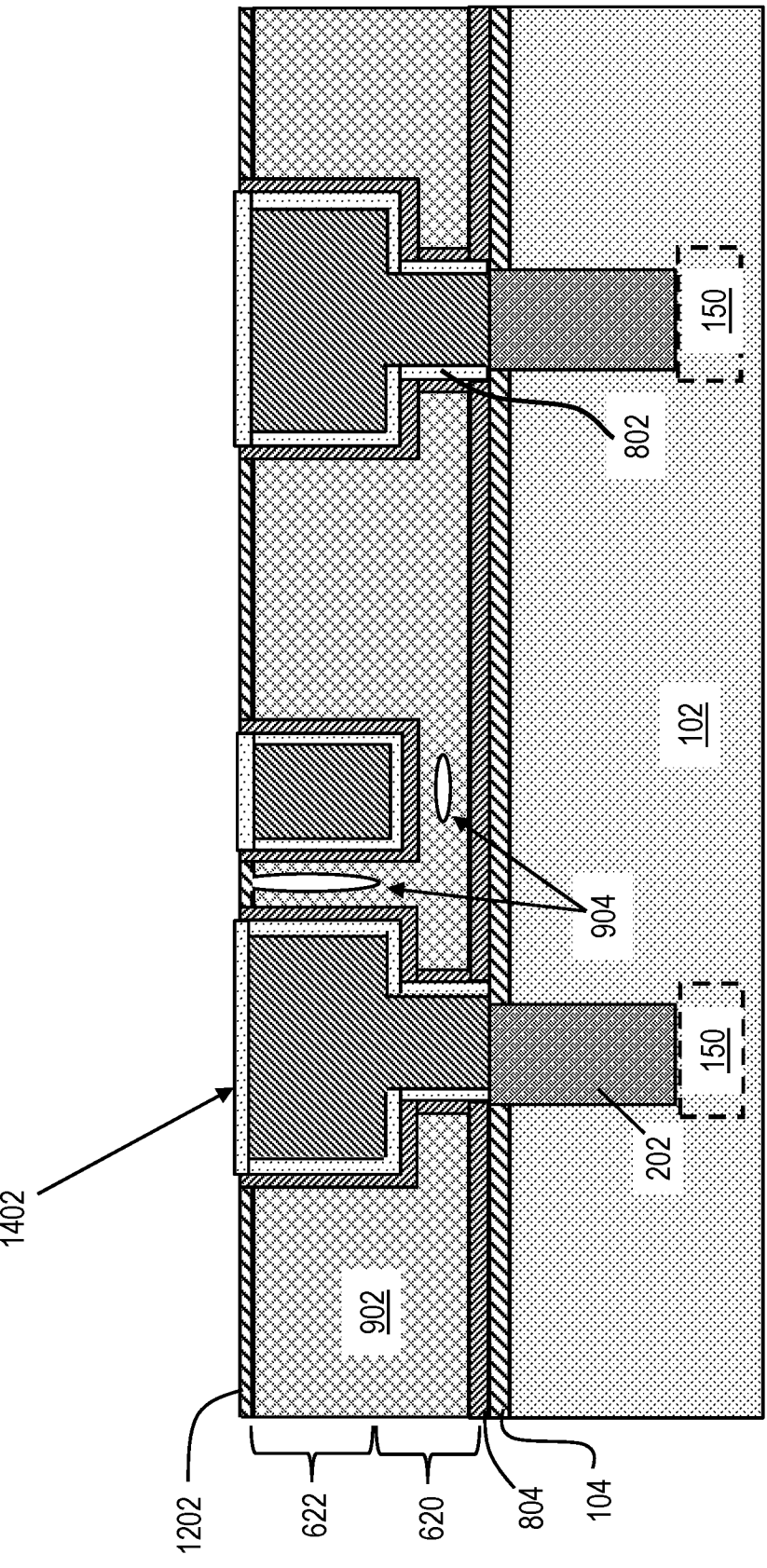
FIG. 14 depicts a cross-sectional view of a portion of an IC under-fabrication after fabrication operations according to one or more embodiments of the invention.

FIG. 14 depicts the IC 100 after selectively depositing a cobalt layer 1402 on the top surfaces of the copper of the metal lines/wires 622, as discussed above.

Figure 15:
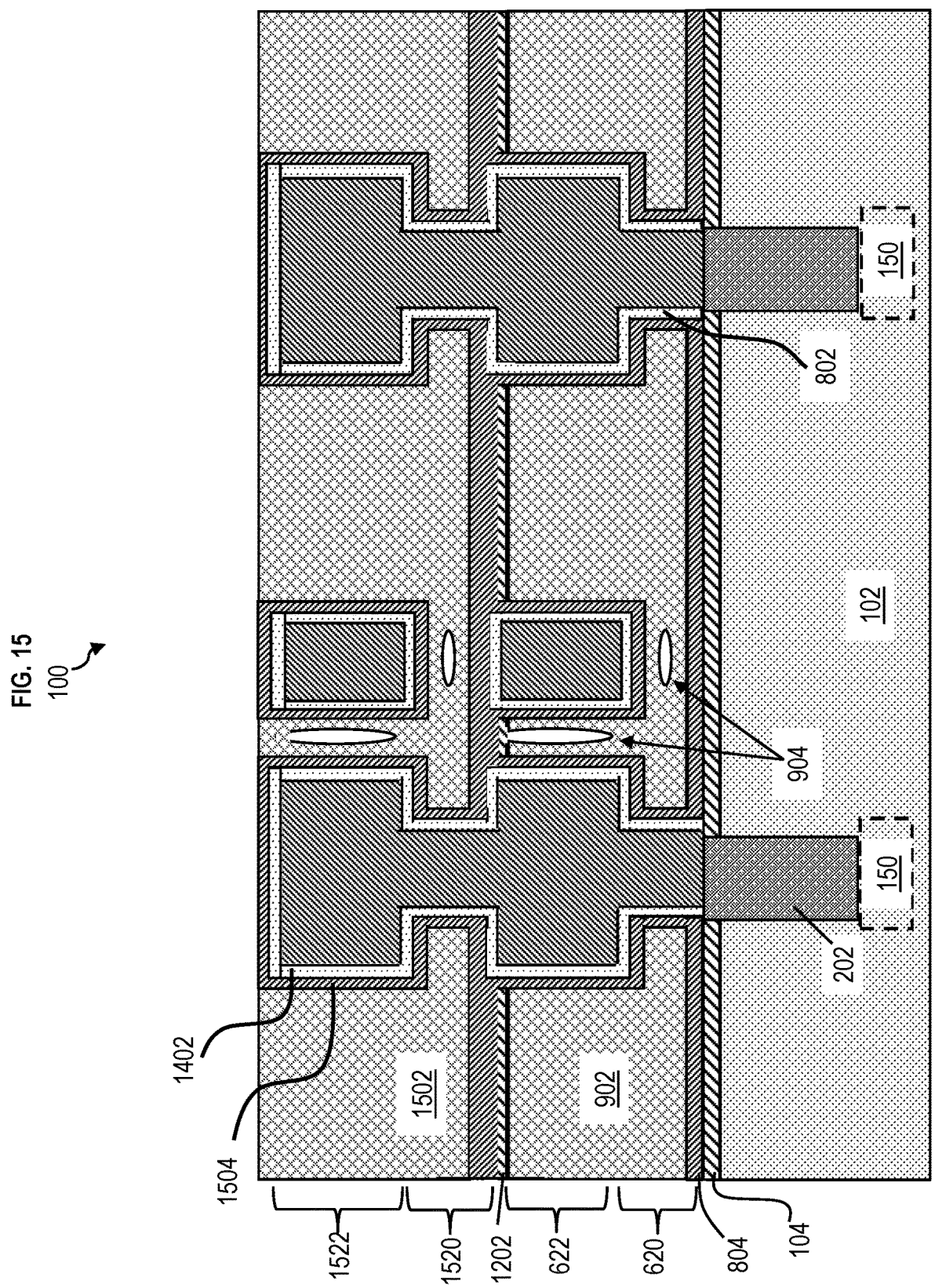
FIG. 15 depicts a cross-sectional view of a portion of an IC under-fabrication after fabrication operations according to one or more embodiments of the invention.

FIG. 15 depicts the IC 100 after repeating the process for the M2 level, and this process can be repeated for subsequent Mx levels. The fabrication processes of FIGS. 3-14 can be repeated for as many metal levels as desired.

For example, via contacts 1520 (e.g., M2 via contacts) and metal lines/wires 1522 (e.g., M2 metal lines/wires) can be formed by depositing and patterning a sacrificial layer that exposes the tops of the metal lines/wires 622. A copper seed layer can be deposited and copper metallization can be performed to form the via contacts 1520 and the metal lines/wires 1522, and CMP is subsequently performed. After removing the sacrificial layer, additional materials of the cobalt layer 1402 and a cap layer 1504 are deposited. The cap layer 1504 is additional material of the cap layer 804.

ILD material for an M2 dielectric layer 1502 is formed and planarized analogous to the M1 dielectric layer 902. Analogous to air gaps 904, one or more air gaps can be formed in the M2 dielectric layer 1502.

As can be seen, there is no traditional thick TaN/Ta or similar liner from the via contact bottom to the top of metal line/wire, thereby providing improved resistance with copper metallization.

FIG. 16 depicts a flowchart of a method 1600 of forming back-end-of-line (BEOL) interconnect structures without a TaN/Ta liner according to one or more embodiments. Reference can be made to any of the figures discussed herein.

At block 1602, the method 1600 includes forming a via contact (e.g., via contact 620) coupled to a middle of line (MOL) contact (e.g., MOL contact 202), a bottom of the via contact being free of a tantalum liner (e.g., a (TaN/Ta) linerless via contact bottom 602). At block 1604, the method 1600 includes forming a metal line (e.g., metal line/wires 622) connected to the via contact (e.g., via contact 620), an interface (a (TaN/Ta) linerless interface 604) between a top of the via contact (e.g., via contact 620) and the metal line (e.g., metal line/wires 622) being free of the tantalum liner (e.g., a (TaN/Ta), the via contact and the metal line including copper, the via contact and the metal line being encapsulated with a cobalt liner 802.

In one or more embodiments, the via contact and the metal line are free of the tantalum liner further having nitride (e.g., free of/excluding a liner having TaN). The via contact and the metal line are free of a stack of another tantalum liner on top of the tantalum liner further having nitride (e.g., free of/excluding a TaN/Ta liner). A cap layer (e.g., cap layer 804) encapsulates the cobalt liner 802. The cap layer (e.g., cap layer 804) includes silicon carbide or a low-k dielectric material doped with nitrogen. The cap layer (e.g., cap layer 804) has a thickness ranging from about 0.1 nanometers (nm) to about 1 nm. A MOL cap layer (e.g., cap layer 104) is formed coplanar with a top surface of the MOL contact 202 such that any misalignment (e.g., misalignment 504) of the via contact and the MOL contact causes a portion of the via contact (e.g., via contact 620) to be disposed on the MOL cap layer (e.g., cap layer 104). The MOL contact includes tungsten.

FIG. 17 depicts a flowchart of a method 1700 of forming back-end-of-line (BEOL) interconnect structures without a TaN/Ta liner according to one or more embodiments. Reference can be made to any of the figures discussed herein.

At block 1702, the method 1700 includes forming a first via contact (e.g., via contact 620) coupled to a middle of line (MOL) contact (e.g., MOL contact 202) without a tantalum liner in between. At block 1704, the method 1700 includes forming a first metal line (e.g., metal lines/wires 622) connected to the first via contact without the tantalum liner in between. At block 1706, the method 1700 includes forming a second via contact (e.g., via contact 1520) connected to the first metal line (e.g., metal lines/wires 622) without the tantalum liner in between. At block 1708, the method 1700 includes a second metal line (e.g., metal lines/wires 1522) connected to the second via contact (e.g., via contact 1520) without the tantalum liner in between, where the first via contact, the second via contact, the first metal line, and the second metal line include copper encapsulated with a cobalt liner 802 and 1402.

The first via contact, the second via contact, the first metal line, and the second metal line are free of the tantalum liner further including nitride (e.g., free of/excluding a liner having TaN). The first via contact, the second via contact, the first metal line, and the second metal line are free of a stack of another tantalum liner on top of the tantalum liner further including nitride (e.g., free of/excluding a TaN/Ta liner).

In one or more embodiments, the ILD material can be $SiO_2$, SiN, a low-k dielectric material or an ultra-low-k dielectric material. Low-k dielectric materials may generally include dielectric materials having a k value of about 3.9 or less. The ultra-low-k dielectric material generally includes dielectric materials having a k value less than 2.5. Unless otherwise noted, all k values mentioned in the present application are measured relative to a vacuum. Exemplary ultra-low-k dielectric materials generally include porous materials such as porous organic silicate glasses, porous polyamide nanofoams, silica xerogels, porous hydrogen silsequioxane (HSQ), porous methylsilsesquioxane (MSQ), porous inorganic materials, porous CVD materials, porous organic materials, or combinations thereof. The ultra-low-k dielectric material can be produced using a templated process or a sol-gel process as is generally known in the art. In the templated process, the precursor typically contains a composite of thermally labile and stable materials. After film deposition, the thermally labile materials can be removed by thermal heating, leaving pores in the dielectric film. In the sol gel process, the porous low-k dielectric films can be formed by hydrolysis and polycondensation of an alkoxide(s) such as tetraetehoxysilane (TEOS).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20° C.). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An interconnect structure comprising:
   a via contact coupled to a middle of line (MOL) contact, a bottom of the via contact being free of a tantalum liner; and
   a metal line connected to the via contact, an interface between a top of the via contact and the metal line being free of the tantalum liner, the via contact and the metal line comprising copper, the via contact and the metal line being encapsulated with a cobalt liner.

2. The interconnect structure of claim 1, wherein the via contact and the metal line are free of the tantalum liner further comprising nitride.

3. The interconnect structure of claim 1, wherein the via contact and the metal line are free of a stack of another tantalum liner on top of the tantalum liner further comprising nitride.

4. The interconnect structure of claim 1, wherein a cap layer encapsulates the cobalt liner.

5. The interconnect structure of claim 4, wherein the cap layer comprises silicon carbide or a low-k dielectric material doped with nitrogen.

6. The interconnect structure of claim 4, wherein the cap layer has a thickness ranging from about 0.1 nanometers (nm) to about 1 nm.

7. The interconnect structure of claim 1, wherein a MOL cap layer is formed coplanar with a top surface of the MOL contact such that any misalignment of the via contact and the MOL contact causes a portion of the via contact to be disposed on the MOL cap layer.

8. The interconnect structure of claim 1, wherein the MOL contact comprises tungsten.

9. A method for an interconnect structure comprising:

forming a via contact on a middle of line (MOL) contact, such that a bottom of the via contact is free of a tantalum liner; and forming a metal line on the via contact, an interface between a top of the via contact and the metal line being free of the tantalum liner, the via contact and the metal line comprising copper, the via contact and the metal line being encapsulated with a cobalt liner.

10. The method of claim 9, wherein the via contact and the metal line are free of the tantalum liner further comprising nitride.

11. The method of claim 9, wherein the via contact and the metal line are free of a stack of another tantalum liner on top of the tantalum liner further comprising nitride.

12. The method of claim 9, wherein a cap layer encapsulates the cobalt liner.

13. The method of claim 12, wherein the cap layer comprises silicon carbide or a low-k dielectric material doped with nitrogen.

14. The method of claim 12, wherein the cap layer has a thickness ranging from about 0.1 nanometers (nm) to about 1 nm.

15. The method of claim 9, wherein a MOL cap layer is formed coplanar with a top surface of the MOL contact such that any misalignment of the via contact and the MOL contact causes a portion of the via contact to be disposed on the MOL cap layer.

16. The method of claim 9, wherein the MOL contact comprises tungsten.

17. An interconnect structure comprising:

a first via contact coupled to a middle of line (MOL) contact without a tantalum liner in between;

a first metal line connected to the first via contact without the tantalum liner in between;

a second via contact connected to the first metal line without the tantalum liner in between; and a second metal line connected to the second via contact without the tantalum liner in between, wherein the first via contact, the second via contact, the first metal line, and the second metal line comprise copper encapsulated with a cobalt liner.

18. The interconnect structure of claim 17, wherein the first via contact, the second via contact, the first metal line, and the second metal line are free of the tantalum liner further comprising nitride.

19. The interconnect structure of claim 17, wherein the first via contact, the second via contact, the first metal line, and the second metal line are free of a stack of another tantalum liner on top of the tantalum liner further comprising nitride.

20. The interconnect structure of claim 17, wherein: a cap layer encapsulates the cobalt liner;

the cap layer comprises silicon carbide or a low-k dielectric material doped with nitrogen; and the cap layer has a thickness ranging from about 0.1 nanometers (nm) to about 1 nm.

* * * * *